SEMICONDUCTOR VARIABLE CIRCUIT
Filed Nov. 5, 1952
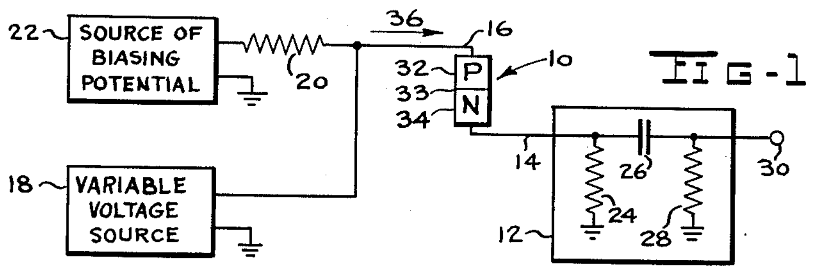
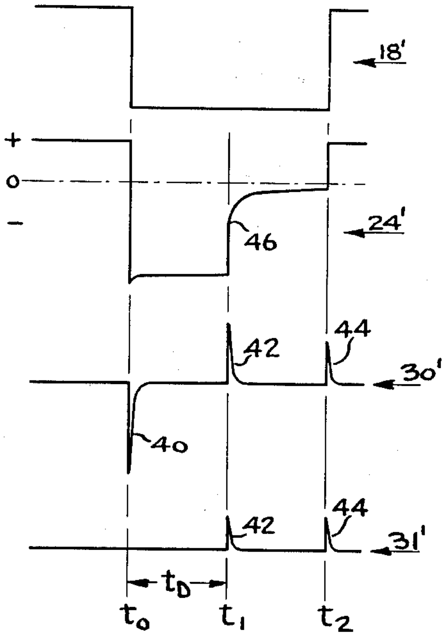
FIG-2
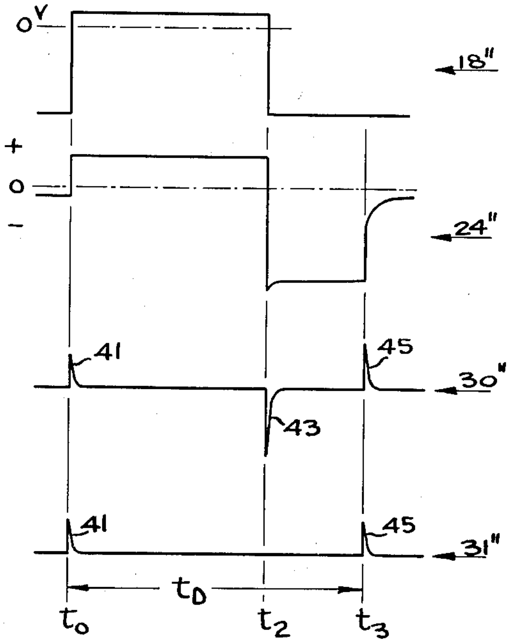
FIG-3
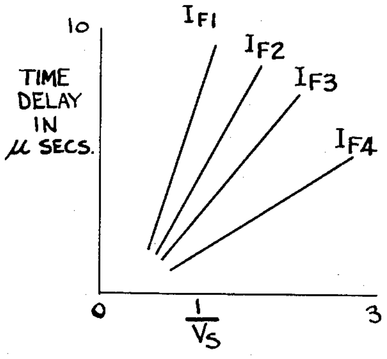
FIG-4
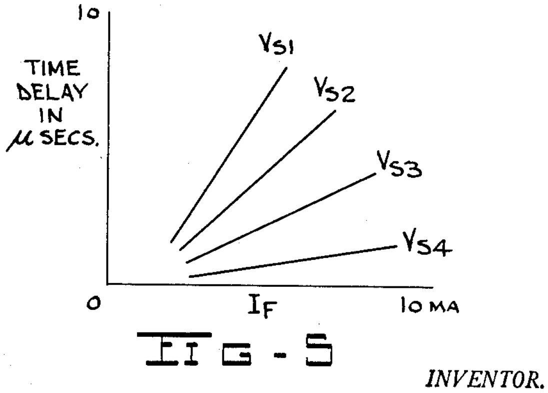
FIG-5
INVENTOR.
MORGAN E. McMAHON
BY
Seymour M. Rosenberg
ATTORNEY.

2,737,601

SEMICONDUCTOR VARIABLE CIRCUIT

Morgan E. McMahon, Los Angeles, Calif., assignor, by mesne assignments, to Hughes Aircraft Company, a corporation of Delaware Application November 5, 1952, Serial No. 318,799

5 Claims. (Cl. 307—88.5)

This invention relates to a semiconductor variable delay circuit and more particularly to a semiconductor delay circuit for delaying an applied electrical input signal for a predetermined time interval, the delay interval provided by the circuit being a function of the amplitude of the applied signal and of the quiescent current through the circuit.

In numerous electrical systems, such as electronic digital computers and pulse code transmission devices, for example, variable voltage electrical signals corresponding to intelligence information are utilized for actuating associated electrical equipment, and for performing arithmetic and control operations. In systems of this nature, the variable voltage electrical signal may have either one of two predetermined voltage levels at any instant, the two voltage levels corresponding to the binary values of one and zero, "yes" and "no," or "on" and "off," respectively.

In electronic systems using two-level variable voltage signals, it is often desirable to delay an electrical signal for a predetermined time interval in order to maintain a desired sequence of operations. For example, in electronic digital computers, the electrical signal corresponding to the carry digit resulting from an arithmetic operation is delayed for a desired interval for utilization in a succeeding arithmetic operation.

In the prior art, this type of delay is most often provided by a delay flip-flop or bistable multivibrator circuit. According to this prior art circuit, the variable voltage signal which is to be delayed is first utilized for gating an electrical clock pulse signal. The gated pulse signal is then applied to a conventional flip-flop in order to store in the flip-flop a signal corresponding to the variable voltage signal. Finally, at the end of the desired delay time interval another electrical clock pulse signal is gated with the output signal from the flip-flop in order to produce a delayed output signal, corresponding to the variable voltage signal.

This prior art circuit has several inherent disadvantages. Firstly, the electrical circuits are relatively complex and require numerous electrical components including vacuum tubes, thereby decreasing the reliability and power efficiency of the circuit. Secondly, the time delay provided is determined by the time interval between successive electrical clock pulses, and thirdly, the electronic gating circuits which are utilized for triggering the flip-flop and for obtaining an output signal therefrom require additional electrical components, thereby making this prior art technique even more complex and expensive.

According to still other prior art techniques, transmission line networks and acoustic delay lines are utilized for producing a delayed output signal corresponding to an applied input signal. The use of acoustic delay lines and transmission lines, either real or artificial, is limited by the fact that the electrical apparatus required is customarily bulky and the delay interval afforded thereby is relatively invariable. In addition, the acoustic delay line is relatively expensive and requires input and output transducers for converting the applied electrical signals to corresponding energy waves in the delay medium and vice versa.

The present invention, on the other hand, provides an electronic variable delay circuit which obviates the above and other disadvantages of the prior art circuits. According to the basic principle of this invention, a junction-type semi-conductor crystal rectifier or diode is placed in series with an electrical differentiating network, and a biasing potential is applied thereacross to provide a predetermined normal forward current through the crystal rectifier. The variable voltage input signal to be delayed is then applied across the crystal rectifier in the reverse or rectifying direction in order to back bias the crystal rectifier.

Due to certain physical phenomena which occur within the crystal rectifier and which will be described in detail later, a momentary surge of reverse current will flow through the rectifier when the input signal is applied but before a rectifying boundary is established within the rectifier. An electrical signal corresponding to the current surge is then produced and differentiated in the associated differentiating network to provide, at the end of the momentary current surge, an electrical output signal corresponding to the applied variable voltage input signal. The time delay thus provided or, in other words, the duration of the momentary current surge, is a function of the forward current which flows through the crystal rectifier prior to the application of the input signal and of the magnitude of the input signal or reverse voltage applied to the rectifier.

Accordingly, the variable time delay circuit of the present invention may be utilized to present an electrical output signal at a predetermined time after the application of a corresponding electrical input signal, the time delay provided by the circuit being determined by the amplitude of the applied signal and the quiescent forward current through the crystal rectifier. In other words, the delay circuit may be considered as an analog element which provides a time delay directly proportional to a first electrical signal, corresponding to the forward current through the rectifier, and inversely proportional to a second electrical signal, corresponding to the amplitude of the applied input signal.

It is, therefore, an object of this invention to provide a variable delay circuit for producing an electrical output signal at a predetermined time after the application of a variable voltage input signal, the time delay provided by the circuit being a function of the amplitude of the applied signal.

Another object of this invention is to provide an electronic variable delay circuit which utilizes the momentary reverse current surge through a junction-type semiconductor diode, upon the application thereto of a back-biasing potential, for producing an electrical pulse output signal at the end of the momentary surge.

A further object of this invention is to provide an electronic variable delay circuit which produces an electrical output signal at a predetermined time after the application thereto of a variable voltage input signal by differentiating the reverse current waveform of a junction-type semiconductor diode which has been back-biased by the applied signal.

Still another object of this invention is to provide a compact and inexpensive variable delay circuit which differentiates an electrical signal corresponding to the reverse current through a normally forward-biased junction-type crystal rectifier, upon the application thereto of a negative signal, to provide an electrical output signal at a predetermined time after the application of the negative signal.

It is still a further object of this invention to provide a method of utilizing a normally front biased junction-type semiconductor crystal rectifier for delaying an electrical input signal for a predetermined time interval.

Still another object of this invention is to provide a method for producing an electrical pulse output signal corresponding to a previously applied variable voltage input signal by applying the input signal to a normally front-biased junction-type semiconductor crystal rectifier to back bias the rectifier.

The novel features which are believed to be characteristic of the invention, both as to its organization and method of operation, together with further objects and advantages thereof, will be better understood from the following description considered in connection with the accompanying drawings in which two embodiments of the invention are illustrated by way of example. It is to be expressly understood, however, that the drawings are for the purpose of illustration and description only, and are not intended as a definition of the limits of the invention.

Fig. 1 is a schematic diagram of an electronic variable delay circuit according to the present invention;

Figs. 2 and 3 are composite diagrams illustrating two different modes of operation for the variable delay circuit shown in Fig. 1; and Figs. 4 and 5 are characteristic curves illustrating the relationship between the magnitudes of the signals applied to the circuit of Fig. 1 and the delay interval provided thereby.

Referring now to the drawings, there is shown in Fig. 1 a variable delay circuit, according to the present invention, which includes a junction-type semiconductor crystal rectifier, connected to one conductor or electrode 14 of rectifier 10. Another electrode 16 of the rectifier is connected to one output terminal of a source 18 of variable voltage and through a resistor 20 to one output terminal of a source 22 of biasing potential. Each of sources 18 and 22 also includes a second output terminal which is grounded.

Differentiating network 12 may be any suitable electrical differentiating network known to the art, and as shown in Fig. 1, for example, includes a resistor 24 interconnecting electrode 14 and ground, a capacitor 26 having one end connected to the junction of resistor 24 and electrode 14, and a resistor 28 interconnecting the other end of capacitor 26 and ground. The function of resistor 24 is to develop an electrical signal whose magnitude corresponds to the waveform of the current through rectifier 10. Capacitor 26 and resistor 28, on the other hand, are utilized for differentiating the electrical signal developed across resistor 24 to present an electrical output signal at an output terminal 30 connected to the junction of capacitor 26 and resistor 28.

Crystal rectifier 10 is preferably a junction-type semiconductor device which has a P-type region of semiconductor material and an N-type region of semiconductor material joined at a transition region, and an associated lead wire or electrode in ohmic contact with each of these regions. Basic to the theory of semiconductor devices of this type is the fact that electrical current may be carried simultaneously by excess electrons, sometimes referred to as electron conduction, and by excess holes or deficit electrons, sometimes referred to as hole conduction.

In the semiconductor art, an N-type region of semiconductor material, such as silicon or germanium, includes an excess of free electrons, while a P-type region is one containing a deficit of electrons or a surplus of holes. Where a continuous solid specimen of semiconductor material has a variable concentration of excess holes and electrons so that a transition from P-type to N-type regions occurs at a relatively thin transition region, the specimen is termed a P-N junction. As shown in Fig. 1, for example, rectifier 10 includes a P-N junction having a P-type region 32 joined at a transition region 33 with an N-type region 34.

In operation, biasing source 22 supplies a predetermined quiescent forward current in the direction of arrow 36 through resistor 20, crystal rectifier 10 and resistor 24 to ground. This current is conducted through crystal rectifier 10 by the simultaneous injection of electrons from N-type region 34 into P-type region 32 and holes from P-type region 32 into N-type region 34. These injected electrons and holes, or, in the terms of the art, these current carriers have a statistically predictable lifetime in the region into which they are injected. According to this concept, the carrier lifetime is denoted by the average length of time that an injected carrier exists before recombination occurs with a carrier of the opposite type.

The relative magnitudes of the electron current and the hole current across transition region 33 of rectifier 10 are a function of the energy levels within the N-type and P-type regions of the semiconductor material and other factors such as resistivity of the semiconductor material. The numbers of holes and electrons which are injected into regions 34 and 32, respectively, are functions of the geometry of the rectifier and the electric field produced within the rectifier by the potential applied thereacross from biasing source 22. In other words, the total number of injected holes and electrons, which corresponds to the forward current conducted by the rectifier, is proportional to the magnitude of the electric field within rectifier 10, this field, in turn, being proportional to the potential applied across the rectifier. A more extensive treatment of the electrical behavior of P-N junction semiconductor devices may be found in the book entitled "Electrons and Holes in Semiconductors" by William Shockley, published in 1950 by D. Van Nostrand Company, Inc., of New York, N. Y.

Referring now to Fig. 2 which illustrates composite waveforms of electrical signals appearing at various points in the circuit of Fig. 1, the signal generally designated 24', which appears across resistor 24, corresponds to the waveform of the electrical current passing through crystal rectifier 10. It will be noted that the quiescent current through rectifier 10, or, in other words, the forward current flowing prior to the time $t_0$ in Fig. 2, produces a positive steady-state potential across resistor 24.

Assume now that at time $t_0$ a negative signal which is to be delayed is applied from variable voltage source 18 to the variable delay circuit of this invention to back bias crystal rectifier 10. This applied signal is illustrated in Fig. 2 by the low level value of the waveform generally designated 18'. Contrary to what a superficial treatment by conventional rectifier theory would at first indicate, rectifier 10 does not become immediately nonconducting upon the application of signal 18' but, instead, conducts a relatively large reverse current for a predetermined time interval. At the end of this interval the rectifying barrier normally associated with crystal rectifiers is established in rectifier 10, thereby lowering the reverse current therethrough to a relatively small value. The time at which the rectifier barrier is established is indicated by the time $t_1$ in Fig. 2 and is accompanied by an essentially instantaneous decrease in the magnitude of the potential across resistor 24 as illustrated at 46 of signal 24'. A theoretical discussion of the electrical behavior of crystal rectifier 10 between times $t_0$ and $t_1$ will be given later in the description of the invention.

Referring again to Fig. 2, the applied signal 18' rises to its high voltage level at time $t_2$, and crystal rectifier 10 is again forward biased from biasing source 22. Thus, the normal quiescent current again flows through rectifier 10 as illustrated by the positive potential of signal 24'.

As signal 24' varies in accordance with the current through rectifier 10, capacitor 26 and resistor 28 coact to differentiate this signal and thereby produce an output signal at output terminal 30. The signal appearing at output terminal 30 is illustrated in Fig. 2 by the waveform generally designated 30′, and includes three electrical pulses 40, 42 and 44 corresponding to the substantially instantaneous variations occurring in the electrical current through rectifier 10 at times $t_0$, $t_1$ and $t_2$, respectively. Pulse signal 40, therefore, corresponds to the applied variable voltage signal at the instant of application, whereas pulse signal 42 corresponds to the applied variable voltage signal delayed through the interval $t_d$ between time $t_0$ and $t_1$. As will be described in detail later, the magnitude of the delay interval may be varied over a relatively wide range by varying either the magnitude of the quiescent current through rectifier 10, the magnitude of the applied variable voltage signal, or both simultaneously.

Assume now, however, that it is desired to utilize the variable delay circuit of this invention to provide an electrical output signal at the end of a predetermined time delay interval. This may be accomplished by merely maintaining constant the amplitude of the applied variable voltage signal with a clamping circuit, for example, and by maintaining the quiescent forward current through the rectifier at a predetermined value. Under these circumstances, each time the variable voltage signal is applied to the circuit of this invention an electrical pulse signal, such as pulse 42 of Fig. 2, will be produced at the end of the desired time interval. The precise relationships between the delay interval, quiescent current and the applied signal will be discussed later in more detail.

It will be noted that pulses 40, 42 and 44 in signal 30′ of Fig. 2 have different amplitudes. It is clear, of course, that these pulses may be clipped by numerous electronic clipping circuits known to the art in order to provide equal amplitudes to all pulses. In addition, negative pulse 40 may be eliminated entirely by merely clipping the negative portion of signal 30′, as illustrated in Fig. 2 by the signal generally designated 31′.

The physical theory underlying the phenomena which occur within crystal rectifier 10 to produce the negative current surge therethrough between times $t_0$ and $t_1$ may best be described by considering the effect upon the rectifier of the applied variable voltage signal. Prior to time $t_0$, as has been stated heretofore, the forward current through crystal rectifier 10 has been conducted by hole and electron injection from regions 32 and 34, respectively, into regions 34 and 32, respectively. When variable voltage signal 18′ is applied at time $t_0$ to the variable delay circuit, the electric field within rectifier 10 is reversed. Accordingly, the physical effect of the electric field within rectifier 10 is now to withdraw the uncombined holes and electrons from regions 34 and 32, respectively, back into regions 32 and 34, respectively. As these electrons and holes flow back toward their respective regions, rectifier 10, in effect, conducts a reverse current of relatively large magnitude, the precise magnitude of this current at the instant $t_0$ being determined by the magnitude of the electric field causing the withdrawal and by the total number of uncombined electrons and holes which are available for withdrawal from regions 32 and 34, respectively. As the withdrawal of holes and electrons into their associated regions takes place, the reverse current through rectifier 10 remains substantially constant, as illustrated in signal 24′ by that portion of the signal occurring between times $t_0$ and $t_1$.

As the net concentration of electrons and holes being withdrawn to their respective regions across transition region 33 of rectifier 10 reaches a critical value which is a function of certain physical parameters of the rectifier, a rectifying barrier is established within rectifier 10 at transition region 33 between P-type region 32 and N-type region 34. The establishment of the rectifying barrier occurs concomitant with a change in the electric field or voltage gradient across rectifier 10 so that the applied variable voltage signal, which heretofore produced a substantially normal voltage gradient, now produces a relatively steep gradient within the portions of the N-type and P-type regions immediately adjacent transition region 33 or, in other words, across the rectifying barrier. The establishment of the rectifying barrier in turn results in an abrupt decrease in the reverse current conducted by rectifier 10, this decrease being designated by step-like portion 46 of signal 24′. It will be noted that after time $t_1$ but before the applied variable voltage signal swings to its high level value at time $t_2$, rectifier 10 continues to conduct a relatively minute current due to diffusion across the barrier region of electrons and holes which may not have been withdrawn prior to time $t_1$ or which may be produced by thermal generation of hole-electron pairs within the semiconductor material. A more rigorous theoretical discussion of the reverse current which flows through junction-type semiconductor rectifiers after the establishment of the rectification barrier may be found in Shockley's book cited above.

In view of the foregoing discussion, it is clear that the length of the delay interval afforded by the variable delay circuit of this invention is a function of two variables. Firstly, the quiescent forward current therethrough, for a given junction-type semiconductor device, establishes the number of injected holes and electrons available for withdrawal upon application of the variable voltage input signal. Secondly, the amplitude of the applied variable voltage signal establishes the strength of the electric field which governs the rate of withdrawal of injected holes and electrons.

In practice it has been found that the time interval through which the applied signal is delayed may be varied continuously from relatively short delays of the order of .05 microsecond to delay intervals approaching 100 microseconds by merely controlling the quiescent forward current through crystal rectifier 10 and the amplitude of the applied variable voltage signal. It is clear, however, that the delay interval for the mode of operation illustrated by the waveforms of Fig. 2 cannot exceed the duration of the applied signal, or in other words, the interval between times $t_0$ and $t_2$. The variable delay circuit of this invention, however, may be utilized to provide delays exceeding the time interval between times $t_0$ and $t_2$ by modifying slightly the mode of operation of the delay circuit.

Referring now to Fig. 3, there is shown a composite diagram of signal waveforms appearing at various points in the circuit of Fig. 1 when the delay circuit is operated in this modified mode. In this instance, rectifier 10 is normally back-biased by the low-level potential of the applied variable voltage signal, generally designated 18″ in Fig. 3. At time $t_0$, a signal to be delayed is applied to the variable delay circuit and signal 18″ swings to its high-level value. Accordingly, junction-type crystal rectifier 10 is forward biased and conducts a forward current proportional to the amplitude of the applied signal, the waveform of the current through rectifier 10 corresponding to the potential developed across resistor 24. This waveform is illustrated in Fig. 3 by the signal generally designated 24″.

Rectifier 10 continues to conduct current in the forward direction until the end of the interval through which signal 18″ remains at its high level value. When signal 18″ returns to its low-level value at time $t_2$, rectifier 10 conducts a surge of reverse current in the manner described for the mode of operation illustrated in Fig. 2, the duration of this surge again being a function of the back-biasing potential across the rectifier and the forward current through the rectifier prior to the application of the back-biasing potential. At a predetermined time $t_3$ after time $t_2$, the reverse current surge is abruptly terminated by the establishment of the rectifying boundary within rectifier 10. Thereafter, the reverse current through the rectifier decreases asymtotically to the normal value shown prior to time $t_0$.

The signal, generally designated 30″, which appears at output terminal 30 again corresponds to the differentiated waveform of the current through rectifier 10. However, the three electrical pulses, 41, 43 and 45, respectively, which appear in output signal 30'' now correspond to the application of the signal to be delayed, the termination of the signal to be delayed, and the delayed output signal, respectively. Thus, it may be seen that the delay interval provided by the variable delay circuit of this invention extends from time $t_0$ to time $t_3$ and is of longer time duration than that of the applied signal.

It is obvious, of course, that signal 30'' may be shaped or clipped in numerous manners known to the art to eliminate any undesired signal components. For example, as illustrated by the waveform generally designated 31'', a signal may be produced which includes only two electrical pulses 41 and 45 corresponding to the application of the signal to be delayed and the corresponding delayed output signal, respectively.

It may be recalled that the time duration of the reverse current surge through crystal rectifier 10 is a function of two parameters, namely, the amplitude of the applied input signal or the back-biasing potential, and the amplitude of the quiescent forward current through the rectifier. Referring now to Fig. 4 and Fig. 5, there is shown typical characteristic curves indicating the relationship between the delay interval provided by the circuit of Fig. 1 while varying one parameter and maintaining the other parameter constant at each of several different values. In Fig. 4, for example, there is shown a family of curves illustrating the relatively linear relationship between the delay interval and the reciprocal of the amplitude of the applied input signal for four different values of forward current. In Fig. 5, on the other hand, the relationship between delay interval and quiescent forward current is illustrated for four different amplitudes of the applied variable voltage input signal. In view of these relationships the following approximation may be formulated.

$$t_D = \frac{KI_F}{V_S} \qquad (1)$$

where:

$t_D$=delay interval in microseconds
$I_F$=forward current in milliamperes
$V_S$=amplitude of applied signal in volts
$K$=proportionality constant It is clear from Equation 1 that in addition to providing a variable time delay for an applied signal, the variable delay circuit of this invention may be utilized in electrical analog computers or simulators for providing either a delay interval or a negative square wave pulse having a time duration which is proportional to the quotient of two quantities represented by analog signals. For example, if the amplitudes of the quiescent current and applied input signal are each controlled by the amplitude of a corresponding analog signal, the time delay provided by the variable delay circuit of this invention will be proportional to the quotient of the signal corresponding to the quiescent forward current divided by the signal corresponding to the applied variable voltage input signal.

It is obvious, of course, that although signal 24' in Fig. 2 is differentiated by the circuit shown in Fig. 1, this signal may be utilized directly in many applications where it is desirable to produce a negative square wave signal whose time duration is proportional to the magnitude of the applied analog signals. In such an application, capacitor 26 and resistor 28 may be eliminated from the circuit of Fig. 1.

It should be understood, of course, that the foregoing disclosure relates to only a preferred embodiment of the invention and that numerous modifications may be made therein by merely applying the skill of the art. For example, differentiating network 12 of Fig. 1 may comprise any of numerous other circuit arrangements which perform the same function as that of the circuit shown and described. In addition, although the semiconductor device shown in Fig. 1 is preferably a junction-type device, it should be understood that other types of semiconductor devices such as heavily-injecting metal-to-semiconductor diodes may also be utilized. Accordingly, the breadth of this invention should be limited only by the spirit and scope of the appended claims.

What is claimed as new is:

1. An electronic variable delay circuit for presenting an electrical output signal at a predetermined time after the application of an electrical input signal, said circuit comprising: a junction-type semiconductor crystal rectifier; a differentiating circuit connected in series with said crystal rectifier; biasing means coupled to said crystal rectifier for normally forward biasing said crystal rectifier; and means for applying the input signal to said crystal rectifier to back bias said crystal rectifier for producing a reverse current surge through said rectifier; said differentiating circuit being responsive to the reverse current surge through said rectifier to produce a delayed electrical output signal corresponding to the applied input signal.

2. An electronic variable time delay circuit for producing an electrical pulse output signal at a predetermined time after the application of an electrical input signal, said delay circuit comprising: a crystal diode; means for biasing said diode to produce a predetermined normal forward current through said diode; means for applying the input signal to said diode for back biasing said diode to cause said diode to conduct a relatively large reverse current for a predetermined time interval and a relatively small reverse current after said predetermined interval, said predetermined interval being a function of the normal forward current and the amplitude of the applied input signal; and a differentiating circuit, coupled to said diode and responsive to the change in the reverse current through said diode from said relatively large current to said relatively small current, for producing an electrical pulse output signal at the end of said predetermined interval.

3. An electronic variable delay circuit responsive to the application of an electrical input signal for producing a corresponding electrical output signal after a predetermined time interval, said circuit comprising: a junction-type semiconductor device having adjacent regions of P-type and N-type semiconductor material; means for normally injecting holes from said P-type region into said N-type region and electrons from said N-type region into said P-type region, said injected holes and electrons conducting a forward current through said device; means for applying the input signal to said semiconductor device in the back-biasing direction to produce a directional electrical field in said P-type and N-type regions proportional to the instantaneous amplitude of the input signal, said field producing an exponentially decreasing net withdrawal of holes and electrons from said N-type and P-type regions, respectively, into said P-type and N-type regions, respectively, said semiconductor device being responsive to a predetermined net hole and electron transfer between said P-type and N-type regions for establishing a rectifying boundary at the interface of said P-type and N-type regions to inhibit further hole and electron transfer between said regions; and a differentiating network connected to said semiconductor device, said differentiating network being responsive to the establishment of said rectifying boundary within said semiconductor device for producing an electrical output signal corresponding to the applied input signal.

4. A semiconductor delay circuit for presenting an electrical output signal at a predetermined time after the application of an electrical input signal, said circuit comprising: a semiconductor rectifier; means for normally front-biasing said rectifier to produce a predetermined forward current therethrough, said rectifier being back-biasable in response to the application of the input signal for producing a momentary reverse current surge having a duration proportional to said predetermined forward current through the rectifier prior to the application of the input signal; means for applying the input signal to said rectifier; and a differentiating circuit connected to said rectifier and responsive to said reverse current surge for producing an electrical output signal at the end of said reverse current surge.

5. A semiconductor variable delay circuit for presenting an electrical output signal at a predetermined time after the application of an electrical input signal, said circuit comprising: a semiconductor rectifier, a resistive element in series with said rectifier for developing an electrical signal having an instantaneous magnitude corresponding to the instantaneous current through said rectifier; biasing means to provide a normal forward current through said rectifier and said resistive element; means for applying the input signal to said rectifier to produce a reverse current surge therethrough; and electrical differentiating means connected to said resistive element for differentiating said electrical signal and responsive to said reverse current surge through said rectifier for producing, at the end of said reverse current surge, a delayed electrical output signal corresponding to the applied input signal.

References Cited in the file of this patent

UNITED STATES PATENTS

| | | |
|---|---|---|
| 2,469,569 | Ohl | May 10, 1949 |
| 2,535,303 | Lewis | Dec. 26, 1950 |
| 2,594,336 | Mohr | Apr. 29, 1952 |